US011297739B1

(12) United States Patent
Gao

(10) Patent No.: US 11,297,739 B1
(45) Date of Patent: Apr. 5, 2022

(54) IT ENCLOSURE SYSTEM AND IN-SERIES CONFIGURATION

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 17/029,931

(22) Filed: Sep. 23, 2020

(51) Int. Cl.
*H05K 7/20* (2006.01)
(52) U.S. Cl.
CPC ....... *H05K 7/2079* (2013.01); *H05K 7/20272* (2013.01); *H05K 7/20781* (2013.01)
(58) Field of Classification Search
CPC ............. H05K 7/20763–2079; H05K 7/20272
See application file for complete search history.

(56) References Cited

U.S. PATENT DOCUMENTS

| 9,215,832 | B2* | 12/2015 | Chang | H05K 7/20781 |
| 9,285,129 | B2* | 3/2016 | Novotny | F24F 3/06 |
| 9,668,382 | B2* | 5/2017 | Steinke | H05K 7/20736 |
| 9,839,164 | B2* | 12/2017 | Shelnutt | H05K 7/20772 |
| 10,010,013 | B2* | 6/2018 | Shelnutt | H05K 7/1488 |
| 10,455,726 | B2* | 10/2019 | Cader | H05K 7/20254 |

* cited by examiner

*Primary Examiner* — Zachary Pape
(74) *Attorney, Agent, or Firm* — Womble Bond Dickinson (US) LLP

(57) ABSTRACT

According to various embodiments, described herein are systems and methods for designing and configuring cooling systems for server racks in an IT cluster. In one embodiment, a cooling system can include a connection module with fluid loop connections and standard fluid ports, and a number of cooling modules, such as a heat exchanger module, a pump module, and a first bypass module, and a second bypass module. The connection module can use the standard fluid connections and standard ports to connect the cooling modules together to form a complete multiple function cooling unit. The cooling unit can be attached to an IT enclosure via the fluid ports on the connection module, and fluid loops are connected between the IT enclosure and each individual cooling modules. The connection module can be customized including the cooling ports, fluid loop connections to accommodate assembling of different standard cooling modules and corresponding functions.

20 Claims, 7 Drawing Sheets

US 11,297,739 B1

IT ENCLOSURE SYSTEM AND IN-SERIES CONFIGURATION

FIELD OF THE INVENTION

Embodiments of the present disclosure relate generally to airflow management in a data center. More particularly, embodiments of the disclosure relate to cooling systems and methods of designing and configuring cooling systems for a data center.

BACKGROUND

With the booming of AI applications, high performance computing, cloud computing and data-driven applications, data centers as well as the compute and storage infrastructures have becoming increasingly critical for a company to maintain its competitive edges. Maintaining a data center is expensive and part of the expenses is related to cooling the data center.

A data center may keep growing in size, and serving and maintaining cooling systems in the data center may become expensive. In some data centers, all the cooling hardware units are integrated as an inseparable unit. If a particular component becomes defective, the whole cooling system may need to be replaced or redesigned, which greatly increases the service and maintenance cost of the data center. In addition, as more efficient cooling hardware becomes available, it would be hard to plug in the new hardware into the existing cooling system. Therefore, designing a cooling solution and an IT enclosure in a combined manner may benefit the modern IT cluster and hardware.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
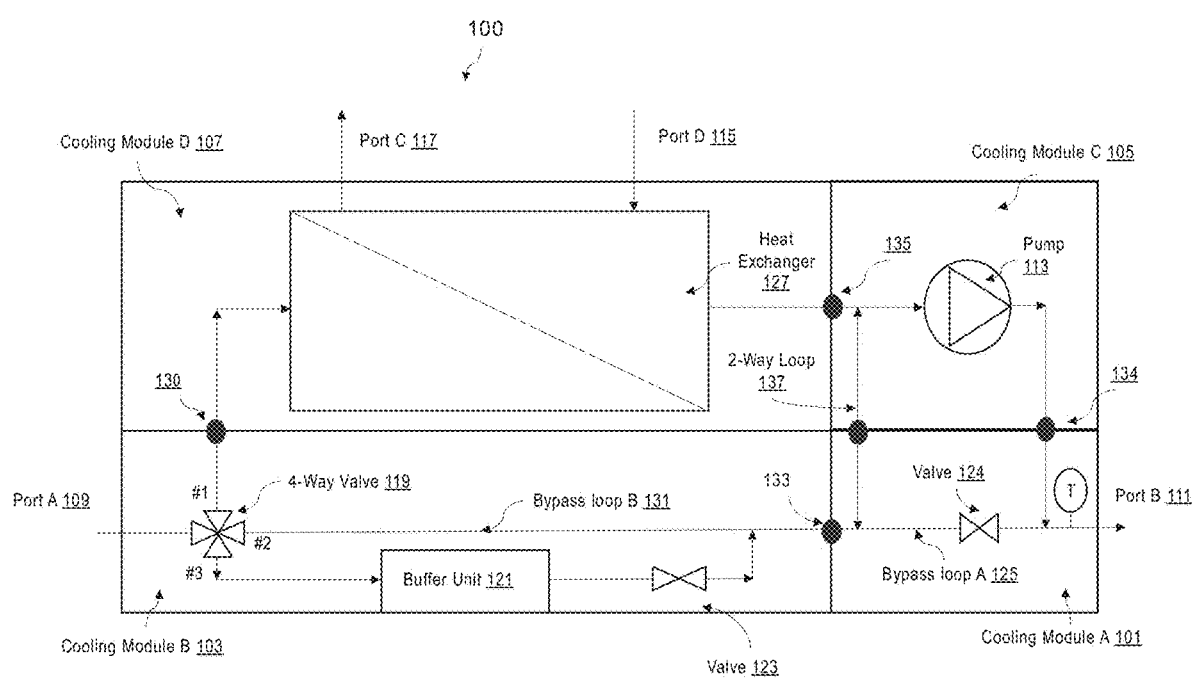
FIG. 1 is a schematic diagram illustrating a cooling system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiments, described herein are systems and methods for designing and configuring cooling systems for server racks in an IT cluster or a data center. In one embodiment, a cooling system can include a connection module with standard fluid connections and standard fluid ports, and a number of cooling modules, such as a heat exchanger module, a pump module, and a first bypass module, and a second bypass module. The connection module can use the standard fluid connections and standard ports to connect the cooling modules together as a single cooling unit, also can be understood as a complete cooling module. The cooling unit can be attached to an IT enclosure, which can be an IT rack with cooling hardware/system In one embodiment, the fluid connections can connect the IT enclosure to the connection module, and connect multiple pairs of the cooling modules. The fluid connections are assembled within the connection module. For example, a fluid connections can connect the first bypass module and the second bypass module, and another fluid connection can connect the heat exchanger and the pump module. These two fluid connections are further connected by a two-way loop in the connection module in one embodiment.

In one embodiment, a pair of fluid ports can be attached to either side of the IT enclosure. Since the IT enclosure is bidirectional and allows the cooling fluid to pass the IT enclosure from either side, either of the pair of fluid ports can be used as an inlet fluid port or an outlet fluid port. The inlet fluid port and the outlet fluid port on the IT enclosure are connected by either an internal fluid connection or other fluid management solutions within the IT enclosure. To enable the fluid flow from the outlet fluid port on the IT enclosure into the second bypass module, part of fluid connection can be in an extension fluid connection that connects the IT enclosure outlet fluid port to the second bypass module inlet fluid port and enables the cooling fluid.

In one embodiment, a fluid port can also be attached to the first bypass module, and functions as an outlet fluid port for the cooling system. The cooling fluid can enter the cooling system via the inlet fluid port on the IT enclosure, and can exit the cooling system via the outlet fluid port.

In one embodiment, the connection module and the cooling modules can be assembled together to form a cooling unit. Although the IT enclosure is a bidirectional, which means that the two fluid ports on the IT enclosure can be both used as either inlet or outlet, the cooling unit is unidirectional, which means that the cooling fluid can pass the connection module and the plurality of cooling modules in the cooling unit only from one direction. Therefore, the outlet fluid port on the first bypass module in the cooling unit can only be used an outlet fluid port, and cannot be used as an inlet fluid port, since fluid flowing direction is controlled by the pump. In another embodiment, if the pump in the module is changed and its fluid pumping direction is changed, the fluid port on the second bypass loop is used as the outlet port and the fluid port on the first bypass loop is used as the inlet port only.

In one embodiment, the connection module can be customized based on design requirements of the cooling system and features of the cooling modules. Features of the IT enclosure is also considered in the design of the cooling system. The cooling modules can be independently serviced and replaced during normal operation of the cooling system. If any of the cooling modules become defective or malfunction, the two bypass loops will be used to create a complete loop for the cooling fluid without the participation of the defective cooling module, thereby ensuring that the defective cooling module can be replaced with minimal impact on the normal operation of the cooling system.

The connection module can be customized for different cooling systems by connecting the modules with cooling modules through standard ports, and the fluid connections within the connection module are for connecting the modules into a complete system.

The various embodiment described above enable different types of cooling hardware to be integrated into a cooling system, and also enable easy servicing and maintaining of the existing cooling hardware in the system. Any of the cooling hardware (e.g., cooling modules) can be replaced by plugging a replacement cooling module into the cooling system via standard fluid ports. Using the above-described features, a variety of cooling systems can be designed, configured, and created, including liquid cooling systems, immersion cooling systems, and hybrid cooling systems.

Additional advantages of such systems include more efficient rack architectures for deploying cooling systems with different types of cooling configurations; modular designs for providing flexibility in service and maintenance; elimination of system or facility loop complexity; and decoupling cooling system designs from facility loop designs.

Another advantage of such cooling systems is that the different standard cooling modules can be plugged into the connection module to form different cooling systems to have different functionalities, which increase the system modularity.

Further advantages of such cooling systems include compatibility with different IT or server configurations, since thermal management and heat transfer capability are configured individually; fast adaptation to variations in deployment requirement; and high reliability.

FIG. 1 is a schematic diagram illustrating a cooling system 100 according to one embodiment. The cooling system 100 includes multiple cooling modules, for example, cooling module A 101, cooling module B 103, cooling module C 105, and cooling module D 107. Cooling module A 101 and cooling module B 103 are bypass modules, cooling module C 105 is a pumping module, and cooling module D 107 is a heat transfer module. The multiple cooling modules 101-107 can be assembled together as a cooling unit, which, in one embodiment, can include one bypass loop.

In one embodiment, cooling module A 101 includes bypass loop A 125, and port B 111, which is a standard fluid outlet port. Port B 111 is attached to cooling module A 101, and fluid comes out of the cooling system 100 from the port 111. Further, within cooling module A 101, a two-way valve 124 is used to control fluid to enable the fluid to move either way. In one embodiment, the cooling module A 101 may be combined with the cooling module B 103.

In one embodiment, cooling module B 103 include bypass loop B 131, which is a more complex bypass loop than bypass loop A 125. Bypass loop B 131 includes a four-way valve 119, and a buffer unit 121 used for a heat exchanger 127 in cooling module section D 107. The buffer unit 121 is controlled by the four-way valve 119 and a two-way valve 123 in the bypass loop 131. Port A 109, which is attached to cooling module B 103 is a fluid inlet port for the cooling unit, and can receive cooling fluid from an inlet fluid port for the cooling system 100 via an extension fluid connection. In one implementation, the extension fluid connection can include multiple fluid connections and multiple fluid ports, and can enable cooling fluid to enter cooling module B 103, from which the cooling fluid can pass through the multiple cooling modules 101-107 in series, and exit the cooling system 100 at port B 111.

In one embodiment, the buffer 121 can be used to buffer the cooling system 101 against variations in fluid flow rates and pressures so that the cooling fluid coming out of the cooling system 100 at port B 111 can have a desired condition.

In one embodiment, the four-way valve 119 can include a number of operation positions. For example, at position #1, the four-way valve 119 can connect to cooling module D 107; at position #2, the four-way valve 119 can direct bypass loop B 131; and at position #3, the four-way valve 119 can connect the buffer unit 121. In one embodiment, the four-way valve 119 can be partially open to multiple positions, for example, only positions #1 and #3 are open, while position #2 is closed.

In one embodiment, cooling module C 105 includes a pump 113, which is used to move fluid within the cooling system 100. Cooling module D 107 includes the heat exchanger 107, which are connected to external cooling sources via port C 117 and port D 115 to form a full fluid circuit. As shown in FIG. 1, port D 115 used is for cooling fluid from another cooling source to come into the heat exchanger 127, and port C 117 is used for cooling fluid to leave the heat exchanger.

In one embodiment, bypass loop A 125 is in parallel with cooling module C 105 and bypass loop B 131 is in parallel with section D 107. Further, a two-way loop 137 can be provided between cooling module A 101 and cooling module C 105 to enable cooling fluid to flow between the two cooling modules 101 and 105.

In one embodiment, each of the cooling modules 105 and 107 can be replaced without impacting the fluid recirculating of the cooling system 100. Without the cooling modules 105 and 107, the cooling system 100 can still function because cooling fluid can bypass the cooling modules 105 and 107 via bypass loop B 131 and bypass loop A 125, as well as pumped by other 105 in a loop. However, since the fluid inlet port A 109 is attached to cooling module B 103 via an extension fluid connection, and the fluid outlet port B 111 is attached to cooling module A 101, replacing either cooling module B 103 or cooling module A 101 may impact the system operation.

In one embodiment, the cooling modules 101-107 can be connected using a connection module that includes multiple fluid connections 130, 133, 134, and 135, each of which connects a pair of fluid ports (only one is shown for each fluid connection in FIG. 1). The two pairs of fluid connections shown in FIG. 1 are connected to each other. The connection module will be discussed in detail below.

Figure 2:
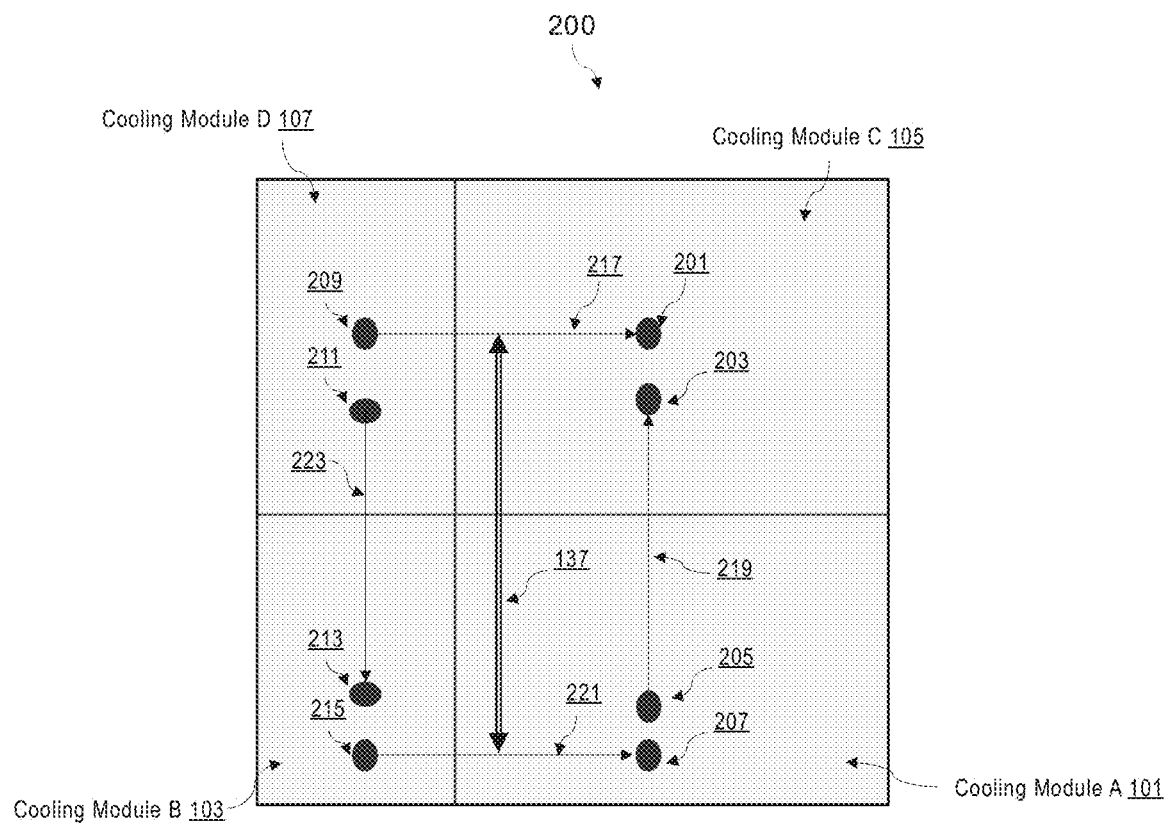
FIG. 2 shows a floor plan view of a connection module according to one embodiment.

FIG. 2 shows a floor plan view of a connection module 200 according to one embodiment. The figure is used to highlight the key components and functions of connections module 200. The connection module 200 can include multiple fluid connections 217-223 and the two-way loop 137. Each of the fluid connections 217-223 can connect to a pair of fluid ports 201-215. The fluid connections can be designed in consideration of the corresponding cooling modules 101-107 to be attached to the connection module 200. As shown in FIG. 2, a fluid connection 217 is connected to fluid ports 201 and 209, a fluid connection 219 is connected to fluid ports 203 and 205, a fluid connection 221 is connected to fluid ports 207 and 215, and a fluid connection 223 is connected to fluid ports 211 and 213. Each of fluid connections 217-223 is a unidirectional loop. The unidirectional feature of each fluid connection defined by the cooling modules attached to it. Each fluid connection is physically capable of allowing cooling fluid to pass in a bidirectional manner. All the fluid connections 217-233 are unidirectional fluid connections which cooling fluid can flow through. As further shown, the unidirectional loops 217 and 221 are connected by the two-way loop 137.

In one embodiment, the fluid ports connected to the fluid connections 217-233 are all standard fluid ports, and are located and assembled in the connection module 200. The cooling modules 101-107 can plug into the connect module 200 via the standard fluid ports.

In one embodiment, each of the cooling modules 101-107 can be standard modules. By customizing while the fluid connections 217-223 and the two-way loop 137 in the connection module 200, a variety of cooling systems can be created. Such cooling systems are highly reliable, easy to be customized, and easy to assemble.

Figure 3:
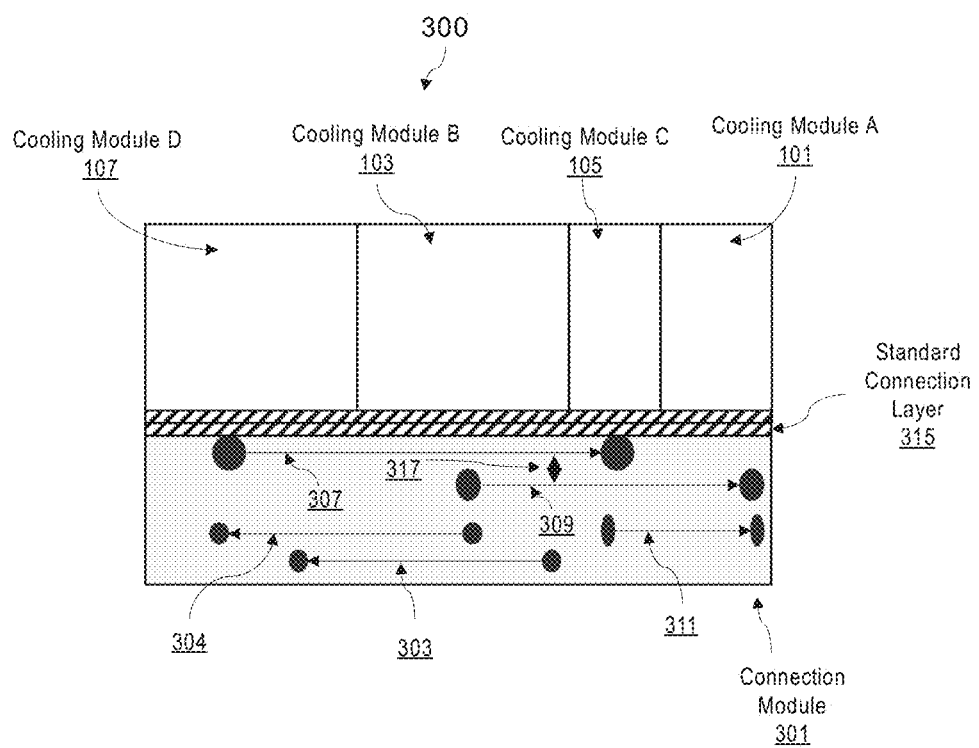
FIG. 3 shows another view of the cooling system according to one embodiment.

FIG. 3 shows another view of the cooling system 100 assembled through the connection module 301 according to one embodiment. In this embodiment, the cooling modules 101-107 are arranged in parallel with a connection module 301. The connection module 301 can include fluid connections 303-311 that are arranged in series. The arrangement of the cooling modules 101-107 is one example of how the cooling modules 101-107 can be arranged. In other embodiments, various other arrangements can be used, and the cooling modules 101-107 can be arranged in many other different sequence. For example, cooling module D 107 and cooling B 103 can switch positions. In another embodiment, each cooling module can be customized, and can be connected using a different connection module.

In one embodiment, a standard connection layer 315 can be used to provide standard fluid ports for the fluid connections 303-311. A number of connection hardware can be used in the standard connection layer 315. Examples of the connection hardware used in the standard connection layer 315 can include, for example, manual mating connection hardware and blind mating connection hardware.

In one embodiment, each of the fluid connections 304-311 is a fluid loop (also referred to as a fluid loop connection), and can connect two cooling modules via the pair of standard fluid ports associated with the connection. For example, the fluid connection 304 can connect cooling module B 103 and cooling module D 107, the fluid connection 307 can connect cooling module C 105 and cooling module D 107, the fluid connection 309 can connect cooling module A 101 and cooling module B 103, and the fluid connection 311 can connect cooling module A 101 and cooling module C 105. Further, a two-way loop 317, similar to the two-way loop 137 in FIG. 1 and FIG. 2, can be used to connect to the fluid connections 307 and 309. The gaps between the ports and the cooling modules 101-107 shown in FIG. 3 is for more clearly representing the design. In actual implementations, there may not such gaps in actual implementations.

In one embodiment, unlike the fluid connections 304-311, the fluid connection 303 is an extension fluid connection, which connects a fluid inlet port to cooling module B 103 on one end, and then connects to an IT outlet port from the other end in one embodiment. System cooling fluid can enter the cooling modules 101-107 through the fluid connection 303.

Figure 4:
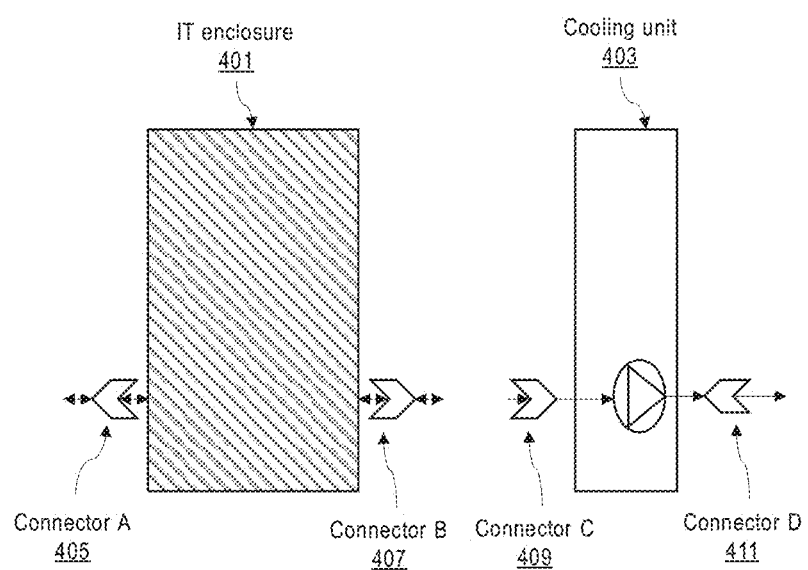
FIG. 4 shows a system design for connecting a cooling unit to an IT enclosure according to one embodiment.

FIG. 4 shows a system design 400 for connecting a cooling unit to an IT enclosure according to one embodiment. In one embodiment, a cooling unit 403 can be connected to an IT enclosure unit 401. The IT enclosure 401 can be an IT rack with cooling hardware/system.

In one embodiment, the cooling unit 403 can comprise the cooling modules 101-107 assembled together using the connection module 301 as described in FIG. 3. The IT enclosure unit 401 and the cooling unit 403 can be delivered separately to a site where they can be assembled together using standard fluid ports. Alternatively, the IT enclosure unit 401 and the cooling unit 403 can be pre-assembled as a single unit and then delivered to a site for installation.

In one embodiment, each of the connectors 405-411 can be a standard fluid port, and each connector can be of the same specifications such that the IT enclosure unit 401 and the cooling unit 403 can be assembled using only such connectors and without using additional parts. Connector C 409 is assembled on the connection module such as the connection module 301 described in FIG. 3, and connector D 411 is assembled on one of the cooling modules.

In one embodiment, the IT enclosure unit 401 can be bi-directional, and the cooling unit 403 can be unidirectional. Therefore, connector A 405 can be used as a fluid inlet port and connector B 407 can be used as a fluid outlet port Alternatively, connector B 407 is used for a fluid inlet port and connector A 405 is then used as a fluid outlet port. Cooling fluid can enter and exit the IT enclosure unit 403 from either side, while cooling fluid can enter the cooling unit 403 only from one side and exit it from another side.

Figure 5A:
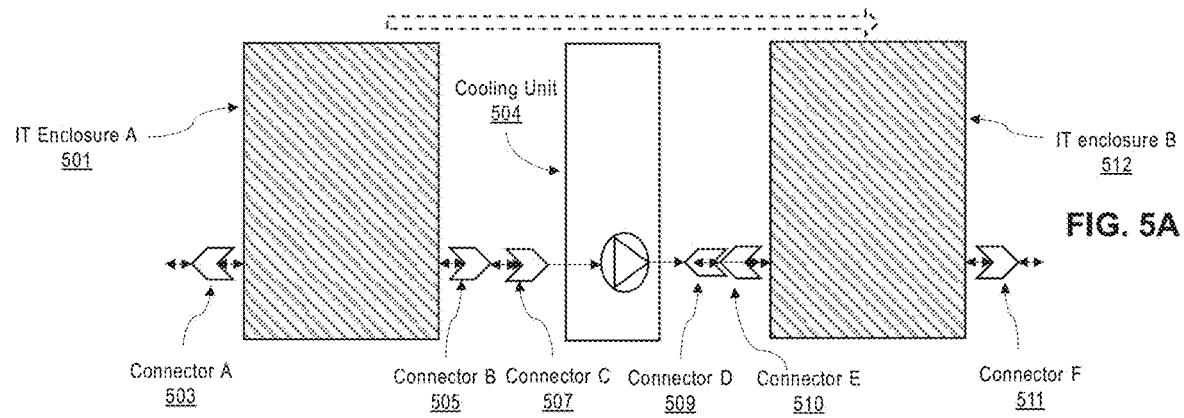
FIGS. 5A-5B show a system design for connecting the IT enclosure to the cooling unit according to one embodiment.
Figure 5B:
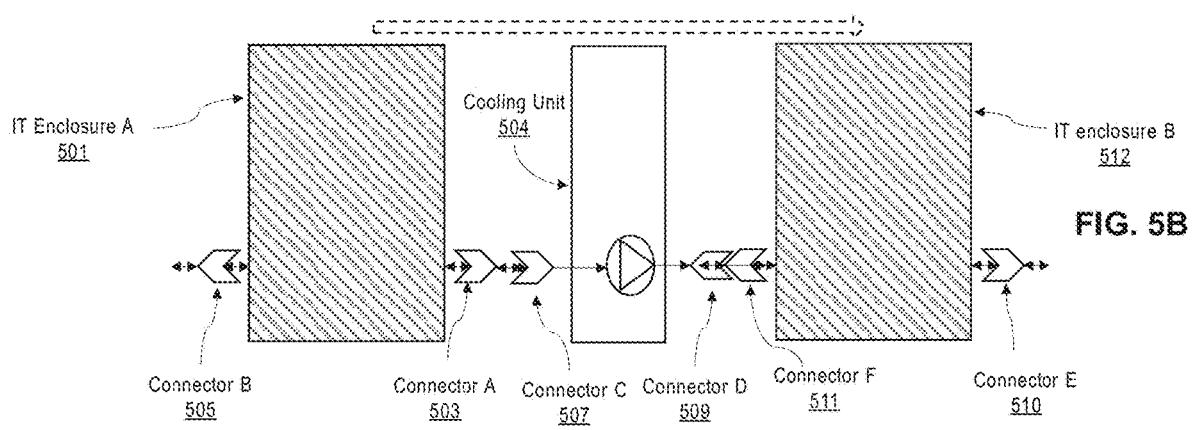

FIGS. 5A-5B show a system design for connecting IT enclosure 501 A and IT enclosure B 512 to the cooling unit 504 according to various embodiments. The design enables different fluid arrangements within the IT enclosures.

FIG. 5A and FIG. 5B show the bi-directional feature of the IT enclosures 501 and 512. In FIG. 5A, cooling fluid enters the IT enclosure 501 from connector A 503 (e.g., a standard fluid port), exits the IT enclosure 501 from connector B 505, and passes the cooling unit 504 via connector C 507 and connector D 509. Subsequently, the cooling fluid coming out of connector D 509 can enter the IT enclosure 512 at connector E 510, and exit the IT enclosure 512 at connector F 511.

In FIG. 5B, the cooling fluid can enter the IT enclosure 501 from a different direction at connector B 505, and enter the IT enclosure 512 at connector F 511 after passing through the cooling unit 504.

In one embodiment, multiple IT enclosures and multiple cooling units can be positioned alternating each other to form a complete fluid circuit.

Figure 6:
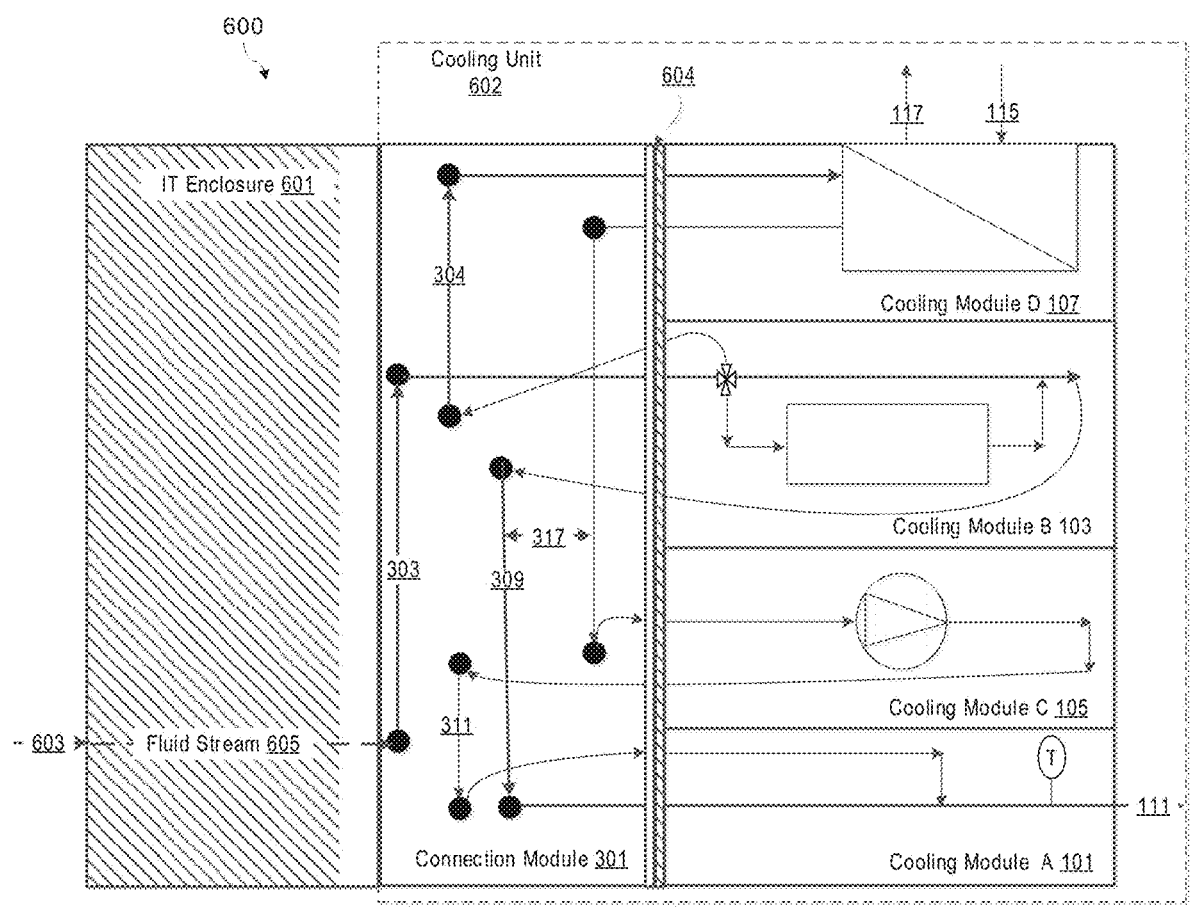
FIG. 6 shows am example design of a cooling system according to one embodiment.

FIG. 6 shows an example design of a cooling system 600 according to one embodiment. More specifically, this embodiment shows that a cooling unit 602 is attached to an IT enclosure 601. The cooling unit 602 can include the cooling modules 101-107 assembled together using the connection module 301. Fluid ports can be located on the connecting edge of the connection module 301 and each of the cooling modules 101-107. The connecting edge of the connection module 602 and the connecting edge of each cooling modules 101-107 forms a standard connection layer 604, which includes a number of standard fluid ports for connecting the connection module 602 and each of the cooling modules 101-107.

In one embodiment, each of the cooling modules 101-107 can connect to the connection module 301 via a pair of standard fluid ports. In addition, cooling section D 107 may include two additional ports 115 and 117 used to connect to external devices. All the standard fluid ports used to assemble the modular cooling modules 101-107 can be located in the connection module 301.

As shown in FIG. 6, cooling fluid 605 enters the system 600 through a standard fluid port 603, enters cooling module B 103 via an extension fluid connection within the connection module 301, and leaves the system 600 through the standard port 111. Within the cooling unit 602, the cooling fluid 605 passes through the connection module 301 and the cooling modules 101-107, and enters cooling module B 103 via the fluid connection 303, which connects the IT enclosure 601 to the cooling unit 602. From cooling module B 103, the cooling fluid 605 can be directed to other cooling modules via the fluid connections 304-311 in the connection section 301. FIG. 6 illustrates how various fluid loops are formed between the IT enclosure 601 and individual cooling modules 101-107.

In FIG. 6, the modularized cooling modules 101-107 can be standard cooling hardware. The cooling fluid 605 flows between the cooling modules 101-107 only through the fluid connections 304-311, which are all located in the connection module 301. Thus, this design decouples the cooling modules 101-107 from the fluid connections, which enables each cooling modules to be replaced with minimum or less impact on the overall design of the cooling system 600. More importantly, then can be quickly replaced or serviced.

Figure 7:
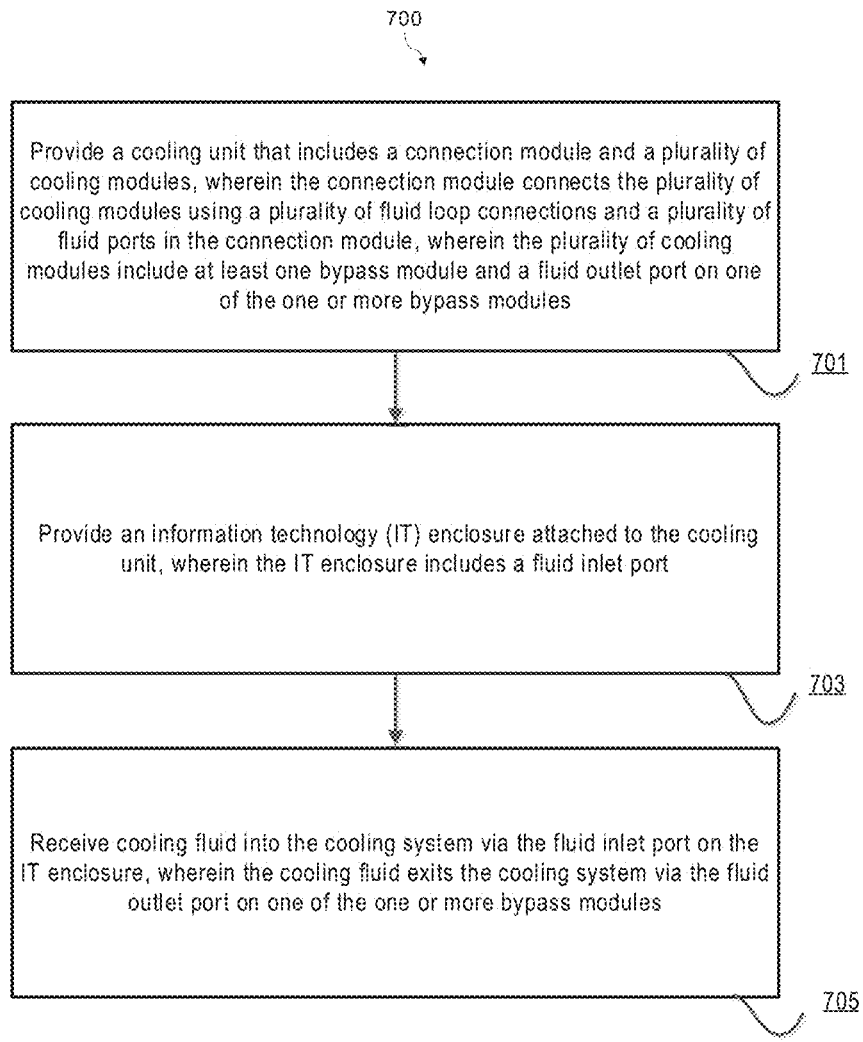
FIG. 7 illustrates a process of creating a cooling a cooling system for a data center.

FIG. 7 illustrates a process of creating a cooling a cooling system for a data center.

In block 701, a cooling unit is provided. The cooling unit includes a connection module and a plurality of cooling modules. The connection module connects the plurality of cooling modules using a plurality of fluid loop connections and a plurality of fluid ports in the connection module. The plurality of cooling modules include at least one bypass module and a fluid outlet port on one of the one or more bypass modules. The connection module is customized and designed, which is critical for forming and designing detailed cooling loops. The connection module is a hardware module that includes a number of standard fluid connections and standard fluid ports. The cooling modules can be more standard and can be integrated with different fluid components providing different functions.

In block 703, an information technology (IT) enclosure is attached to the cooling unit. The IT enclosure is an IT rack with cooling hardware/system, and includes a fluid inlet port.

In block 705, cooling fluid is received into the cooling system via the fluid inlet port on the IT enclosure, and the cooling fluid exits the cooling system via the fluid outlet port on one of the one or more bypass modules.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling system in a data center, comprising:
    a cooling unit that includes a connection module and a plurality of cooling modules, wherein the connection module connects the plurality of cooling modules using a plurality of fluid loop connections and a plurality of fluid ports in the connection module, wherein the plurality of cooling modules includes one or more bypass modules and a fluid outlet port is disposed on one of the one or more bypass modules; and
    an information technology (IT) enclosure attached to the cooling unit, the IT enclosure containing one or more servers and each server containing one or more processors,
    wherein the IT enclosure includes a fluid inlet port, wherein cooling fluid enters the cooling system via the fluid inlet port on the IT enclosure, and exits the cooling system via the fluid outlet port on one of the one or more bypass modules, and wherein the cooling fluid is to reduce temperatures of the one or more processors of the one or more servers.

2. The cooling system of claim 1, wherein the plurality of cooling modules includes a heat exchanger module, a pumping module, a first bypass module, and a second bypass module, wherein the fluid outlet port is attached to the first bypass module.

3. The cooling system of claim 2, wherein an extension fluid loop connection connects the fluid inlet port on the IT enclosure to a fluid port on the second bypass module.

4. The cooling system of claim 3, wherein the plurality of fluid loop connections includes a first fluid loop connection that connects the first bypass module and the second bypass module, and a second fluid loop connection that connects the heat exchanger module and a pump module.

5. The cooling system of claim 4, wherein the connection module further includes a two-way loop that connects the first fluid loop connection and the second fluid loop connection.

6. The cooling system of claim 1, wherein the cooling fluid passes the IT enclosure in a bidirectional manner, and passes the cooling unit in a unidirectional manner.

7. The cooling system of claim 1, wherein the cooling unit includes a connection layer formed by a connecting edge of the connection module and a connecting edge of each of the plurality of cooling modules, wherein the connection layer includes a plurality of connection ports.

8. The cooling system of claim 1, wherein the connection module is customizable to include different fluid ports and different fluid loops for assembling a different set of cooling modules.

9. The cooling system of claim 1, wherein the plurality of fluid loop connections integrated into the connection module are to simplify a cooling unit design, and enables cooling module configurations.

10. The cooling system of claim 1, wherein the cooling unit is one of a plurality of cooling units, and the IT enclosure is one of a plurality of IT enclosures, wherein the plurality of cooling units and the plurality of IT enclosures are positioned alternating each other to form a complete fluid circuit.

11. A method of creating a cooling system for a data center, comprising:
 providing a cooling unit that includes a connection module and a plurality of cooling modules, wherein the connection module connects the plurality of cooling modules using a plurality of fluid loop connections and a plurality of fluid ports in the connection module, wherein the plurality of cooling modules includes one or more bypass modules and a fluid outlet port is disposed on one of the one or more bypass modules;
 providing an information technology (IT) enclosure attached to the cooling unit, wherein the IT enclosure includes a fluid inlet port, wherein the IT enclosure contains one or more servers and each server includes one or more processors; and
 receiving cooling fluid into the cooling system via the fluid inlet port on the IT enclosure, wherein the cooling fluid exits the cooling system via the fluid outlet port on one of the one or more bypass modules, and wherein the cooling fluid is to reduce temperatures of the one or more processors of the one or more servers.

12. The method of claim 11, wherein the plurality of cooling modules includes a heat exchanger module, a pumping module, a first bypass module, and a second bypass module, wherein the fluid outlet port is attached to the first bypass module.

13. The method of claim 12, wherein an extension fluid loop connection connects the fluid inlet port on the IT enclosure to a fluid port on the second bypass module.

14. The method of claim 13, wherein the plurality of fluid loop connections includes a first fluid loop connection that connects the first bypass module and the second bypass module, and a second fluid loop connection that connects the heat exchanger module and a pump module.

15. The method of claim 14, wherein the connection module further includes a two-way loop that connects the first fluid loop connection and the second fluid loop connection.

16. The method of claim 11, wherein the cooling fluid passes the IT enclosure in a bidirectional manner, and passes the cooling unit in a unidirectional manner.

17. The method of claim 11, wherein the cooling unit includes a connection layer formed by a connecting edge of the connection module and a connecting edge of each of the plurality of cooling modules, wherein the connection layer includes a plurality of connection ports.

18. The method of claim 11, wherein the connection module is customizable to include different fluid ports and different fluid loops for assembling a different set of cooling modules.

19. The method of claim 11, wherein the plurality of fluid loop connections integrated into the connection module are to simplify a cooling unit design, and enables cooling module configurations.

20. The method of claim 11, wherein the cooling unit is one of a plurality of cooling units, and the IT enclosure is one of a plurality of IT enclosures, wherein the plurality of cooling units and the plurality of IT enclosures are positioned alternating each other to form a complete fluid circuit.

* * * * *